United States Patent
Chiang

(10) Patent No.: US 6,359,579 B1
(45) Date of Patent: Mar. 19, 2002

(54) DIGITAL LOGIC CORRECTION CIRCUIT FOR A PIPELINE ANALOG TO DIGITAL (A/D) CONVERTER

(75) Inventor: Meei-Ling Chiang, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/506,037

(22) Filed: Feb. 17, 2000

(51) Int. Cl.[7] .................................................. H03M 1/12

(52) U.S. Cl. ........................ 341/155; 341/118; 341/156; 341/161

(58) Field of Search ................................ 341/155, 156, 341/162, 161, 118, 122, 116, 159, 129, 111

(56) References Cited

U.S. PATENT DOCUMENTS

| | | | |
|---|---|---|---|
| 4,633,223 A | | 12/1986 | Senderowicz |
| 4,994,808 A | | 2/1991 | Wichelman |
| 5,043,732 A | | 8/1991 | Robertson et al. |
| 5,047,772 A | * | 9/1991 | Ribner .................. 341/156 |
| 5,157,398 A | | 10/1992 | Okazaki et al. |
| 5,274,377 A | | 12/1993 | Matsuura et al. |
| 5,465,093 A | | 11/1995 | Kusumoto et al. |
| 5,534,864 A | | 7/1996 | Ono et al. |
| 5,541,602 A | | 7/1996 | Opris et al. |
| 5,572,212 A | | 11/1996 | Levinson et al. |
| 5,635,937 A | | 6/1997 | Lim et al. |
| 5,710,563 A | * | 1/1998 | Vu et al. .................. 341/161 |
| 5,771,012 A | * | 6/1998 | Shu et al. ................ 341/118 |
| 5,861,832 A | | 1/1999 | Nagaraj |
| 5,870,041 A | | 2/1999 | Lee et al. |
| 5,874,912 A | | 2/1999 | Hasegawa |
| 6,166,675 A | * | 12/2000 | Bright ..................... 341/162 |
| 6,222,478 B1 | * | 4/2001 | Bright ..................... 341/162 |

FOREIGN PATENT DOCUMENTS

EP 0817 390 A1 1/1998

OTHER PUBLICATIONS

Error Analysis in Pipeline A/D/ Converters and its Applications, K. Hadidi and G. Temes, 8090B IEEE Transactions on Circuits and Systems II: Analog and Digital Signal Processing 39 (1992) Aug., No. 8, New York, US.
U.S. Application No. 09/506,316, filed Feb. 17, 2000, claims 1 to 36.

(List continued on next page.)

Primary Examiner—Brian Young
Assistant Examiner—John B. Nguyen
(74) Attorney, Agent, or Firm—Renner, Otto, Boisselle & Sklar, LLP

(57) ABSTRACT

A digital logic correction (DLC) circuit for a pipeline analog to digital (A/D) converter. The A/D converter having a plurality of stages, each stage producing at least a pair of digital output bits from which a digital representation of an analog input signal can be obtained. The DLC circuit has an adder, the adder having a plurality of inputs and an output. The DLC circuit has a plurality of digital delay sets, each digital delay set comprising at least one digital delay, an input of the digital delay set receiving a corresponding digital output bit and an output of the delay set providing a delayed digital output bit to a respective adder input. The DLC circuit has a clock generator, the clock generator providing clock signals to the DLC circuit to synchronize the arrival of the output of each digital delay set at the adder inputs during a data-valid-period. A primary clock signal is applied to the digital delay sets for every other stage. A secondary clock signal is applied to the remaining digital delay sets. The timing of the primary and secondary clock signals being effective to delay the digital output bits of each stage via the respective digital delay sets to cause the digital output bits to arrive at the adder inputs during the data-valid-period so that the adder produces the digital representation of the analog input signal at the adder output.

12 Claims, 9 Drawing Sheets

OTHER PUBLICATIONS

U.S. Application No. 09/506,208, filed Feb. 17, 2000, claims 1 to 17.
U.S. Application No. 09/506,284, filed Feb. 17, 2000, claims 1 to 27.
A Pipelines 5–Msample/s 9–bit Analog–to–Digital Converter, Stephen H. Lewis and Paul R. Gray, IEEE Journal of Solid–State Circuits, vol. Sc–22, No. 6, Dec. 1987, 954–961.
A 10–b 20–Msample / s Analog–to–Digital Converter, Stephen H. Lewis, H. Scott Fetterman, et al., IEEE Journal of Solid–State Circuits, vol. 27, No. 3, Mar. 1992, 351–358.
A 10 b, 20 Msample/s, 35 mW Pipeline A/D Converter, Thomas Byunghak Co and Paul R. Gray, IEEE Journal of Solid–State Circuits, vol. 30, No. 3, Mar. 1995, 166–172.
A 250–mW, 8–b, 52–Msamples/s Parrellel–Pipelined A/D Converter with Reduced Number of Amplifiers, IEEE Journal of Solid–State Circuits, vol. 32, No. 3, Mar. 1997, 312–320.
A 13–b 2.5–Mhz Self–Calibrated Pipelined A/D Converter in 3–$\mu$m CMOS, Uyh–Min Line, et al., IEEE Journal of Solid–State Circuits, vol. 26, No. 4, Apr. 1991, 628–636.

* cited by examiner

DIGITAL LOGIC CORRECTION CIRCUIT FOR A PIPELINE ANALOG TO DIGITAL (A/D) CONVERTER

TECHNICAL FIELD

The present invention generally relates to pipeline analog to digital (A/D) converters and, more particularly, to a pipeline A/D converter digital logic correction circuit with a reduced number of shift registers.

BACKGROUND

There is an ever present demand for analog to digital (A/D) converters that accurately convert an analog voltage signal into a digital representation. There is also a need for faster A/D converters that use less power and have smaller areas on an integrated circuit.

FIG. 1 illustrates a conventional pipeline analog to digital (A/D) converter 10. The A/D converter 10 converts an analog electrical input signal ($V_{IN}$) into a digital representation of the analog signal ($D_{out}$). The illustrated example is a 4-bit A/D converter, but it should be understood that a resolution of more or less bits may be implemented with the addition or removal of converter stages. Therefore, the resolution of the A/D converter will sometimes be referred to an N-bit A/D converter, where N represents the number of digital output bits. The A/D converter 10 has an analog signal input 12 provided on an initial stage. The initial stage is a sample-and-hold amplifier (SHA) 14. The SHA 14 samples the analog input signal and holds the sampled voltage, or $V_{s/h}$, for the next stage of the pipeline A/D converter 10 at an SHA output 16. The stage following the SHA 14 is a multiplying digital to analog converter (MDAC) 18. MDAC 18 stages are added to the pipeline to increase the number of output bits.

With additional reference to FIG. 2, each MDAC 18 has an analog input 20 and an analog output 22. Each MDAC 18 performs analog to digital conversion of an MDAC input signal, $V_I$, applied to the analog input 20. Each MDAC 18 also calculates an amplified residue signal, $V_{res}$, which is output for the next stage at the analog output 22. The number of MDAC 18 stages is determined by the desired resolution of the A/D converter 10, or the value of N. The number of MDAC 18 stages is equal to N minus two. In the example, the resolution is four bits. Therefore there are two MDAC 18 stages, referred to as $MDAC_1$ (reference numeral 24) and $MDAC_2$ (reference numeral 26). The SHA output 16 is connected to the analog input 20 of $MDAC_1$. The analog output 22 of MDAC, is connected to the analog input 20 of $MDAC_2$. Therefore, the $V_I$ of each MDAC 20, other than $MDAC$, which receives $V_{s/h}$, is the $V_{res}$ of the preceding MDAC 18, also referred to herein as $V_{res m}$ where m stands for the MDAC 18 generating the output signal. The analog output 22 of the last MDAC 18, which is $MDAC_2$ in the example, is connected to an input 28 of a last stage 30. The last stage 30, which will be discussed in more detail below, has no analog output.

Each MDAC 18 and the last stage has two digital outputs 32, 34 for providing one bit of resolution and one bit for correcting error. The bits are generically referred to as $b_1$ and $b_0$, or, for a specific MDAC 18, are referred to as $b_{m1}$ and $b_{m0}$ where m stands for the MDAC 18 generating the output signal or the last stage 30. It is noted that $MDAC_1$ generates $b_{11}$ and $b_{10}$ with some degree of errors $MDAC_2$ generates $b_{21}$ and $b_{20}$ with some degree of error and so forth. With additional reference to FIG. 4, the last stage 30 of the illustrative four bit A/D converter 10 generates $b_{31}$ and $b_{30}$, where $b_{30}$ is the least significant bit (LSB) and $b_{31}$ is used to correct error generated by $MDAC_2$ by adding $b_{31}$ and $b_{20}$. As illustrated, $b_{21}$ is added to $b_{10}$ to correct error generated by $MDAC_1$. In general, therefore, $b_{m1}$ is used to correct the error generated by $MDAC_{m-1}$.

Still referring to FIGS. 1 and 2, each MDAC 18 has a 1.5 bit analog to digital converter (ADC) 36 for generating $b_1$ and $b_0$ from $V_I$. Table 1 is a definition table for the values of $b_1$ and $b_0$ with respect to $V_I$ for the MDAC 18. It is noted that $\pm V_r$ is the full scale range of the ADC 36.

TABLE 1

| Input Voltage Range ($V_I$) | $b_1$ | $b_0$ |
|---|---|---|
| $V_I < -V_r/4$ | 0 | 0 |
| $-V_r/4 < V_I < +V_r/4$ | 0 | 1 |
| $V_I > +V_r/4$ | 1 | 0 |

Once $b_1$ and $b_0$ are generated by the ADC 36 they are output at digital outputs 32, 34 and also input into a 1.5 bit digital to analog converter (DAC) 38. The DAC 38 converts $b_1$ and $b_0$ into an analog signal, or $V_{DAC}$, used in the calculation of $V_{res}$. Table 2 is a definition table for the value of $V_{DAC}$ with respect to $b_1$ and $b_0$ for the MDAC 18.

TABLE 2

| $b_1$ | $b_0$ | $V_{DAC}$ |
|---|---|---|
| 0 | 0 | $-V_r/2$ |
| 0 | 1 | 0 |
| 1 | 0 | $+V_r/2$ |

The MDAC 18 generates $V_{res}$ by subtracting $V_{DAC}$ from $V_I$ with an adder 40 and amplifying the summed value with an amplifier 42 having a gain of two. With additional reference to FIG. 3, the characteristics of the MDAC 18 are illustrated. FIG. 3 graphs $V_I$ versus $V_{res}$ and illustrates the values of $b_1$ and $b_0$ over the range of values for $V_I$.

The last stage 30 is a two bit analog to digital converter (ADC) for converting the last stage's input voltage, $V_I$, into a two bit digital value. Therefore, similar to the MDACs 18, the last stage has two digital outputs 32, 34 respectively providing $b_1$ and $b_0$. The $b_0$ provided at the second digital output 34 for the last stage 30 represents the least significant bit of the digital output of the A/D converter 10. Alternatively, the last stage 30 can be implemented with an MDAC 18 without connecting the output 22 to any other stage. Table 3 is a definition table for the values of $b_1$ and $b_0$ with respect to $V_I$ for the two bit last stage 30.

TABLE 3

| Input Voltage Range ($V_I$) | $b_1$ | $b_0$ |
|---|---|---|
| $V_I < -V_r \cdot 3/4$ | 0 | 0 |
| $-V_r \cdot 3/4 < V_I < -V_r/4$ | 0 | 1 |
| $-V_r/4 < V_I < +V_r/4$ | 1 | 0 |
| $V_I > +V_r/4$ | 1 | 1 |

The digital outputs of the MDACs 18 and the last stage 30 are input into a digital logic correction circuit 44. The digital logic correction circuit 44 generates the digital output, $D_{OUT}$, of the A/C converter 10. The digital output is a series of bits, or $D_{N-1}$ to $D_0$. In the example, N is four bits. Therefore, the digital output is $D_3$, $D_2$, $D_1$ and $D_0$ where $D_3$ is the most significant bit (MSB) and $D_0$ is the least significant bit (LSB). The digital logic correction circuit 44 corrects error caused by inaccurate thresholds in the 1.5 bit ADC 36 of the MDACs 18 and the two bit ADC of the last stage 30. As long as the individual thresholds deviate no more than $V_r/4$ from an ideal value, then the error can be corrected by adding shifted digital outputs of each of the stages.

FIG. 4 depicts a shifting operation of the digital error correction circuit 44. It is noted that S is the number of stages of the A/D converter 10 excluding the SHA 14 and the last stage 30. In other words, S is the number of MDACs 18 in the pipeline A/D converter 10.

FIG. 5 is a graph of the characteristics of the 4-bit A/D converter 10 illustrated in FIG. 1, under the condition that the thresholds for the 1.5 bit ADC 36 of the MDACs 18 and the 2 bit ADC of the last stage 30 deviate no more than $V_r/4$. It is noted that $\pm V_R$ is the full scale range of the A/D converter 10. It is also noted that an analog input voltage of zero volts is defined as the center of digital 1000. However, if the thresholds of the two bit ADC of the last stage 30 are $+V_r*3/4$, $+V_r/4$ and $-V_r/4$, rather than the thresholds shown in Table 3, the A/D conversion curve illustrated in FIG. 5 will move one LSB to the right resulting in analog input voltage of zero volts being defined as the center of digital 0111.

Referring to FIGS. 2 and 13, the timing of the A/D converter 10 will be discussed. The A/D converter 10 has a bias and reference generator (not shown) and a clock generator (not shown). The bias and reference generator generates appropriate bias currents and voltage references for use by the various stages of the A/D converter 10. The clock generator generates a two phase nonoverlapping clock signal, the respective clock pulse signals of which are referred to as CLK1 and CLK2. Waveforms for the two clock pulse signals, CLK1 and CLK2, are illustrated in the top portion of FIG. 13. CLK1 effectively has about a 50% duty cycle. CLK2 also effectively has about a 50% duty cycle but lags CLK1 by 180°.

As illustrated in FIG. 2, CLK1 is applied to a sample clock input SA of the SHA 14 and a hold clock input H of the amplifier 42 of MDAC$_1$. CLK2 is applied to a hold clock input H of the SHA 14, a latch clock input L of the ADC 36 of MDAC$_1$ and a sample clock input SA of the amplifier 42 of MDAC$_1$. As indicated by FIG. 13, the same clock signals are used for MDAC$_2$, but the clock signals are alternated. More specifically, CLK1 is applied to the latch clock input L of the ADC 36 of MDAC$_2$ and the sample clock input SA of the amplifier 42 of MDAC$_2$ and CLK2 is applied to the hold clock input H of the amplifier 42 of MDAC$_2$. If additional MDAC 18 stages are present for a higher resolution A/D converter 10, the third and subsequent MDACs 18 alternately use CLK1 and CLK2 for the sample/latch operation and the hold operation so that the sample/latch of the MDAC 18 coincides with the hold of the previous MDAC 18. CLK2 is applied to a latch clock input of the last stage 30. It is noted that the last stage 30 does not conduct sample and/or hold operations since the last stage 30 does not generate a residue output.

The sample, hold and latch operations of the SHA stage 14, MDAC$_1$, MDAC$_2$, and the last stage 30 are illustrated in the bottom portion of FIG. 13. The different shading in the timing diagram represents the pipeline conversion process on a series of two analog input samples as the samples pipeline through all of the stages. The SHA 14 samples the analog input signal, $V_{IN}$, during CLK1 and conducts a hold operation during CLK2. MDAC$_1$ samples $V_{s/h}$ during CLK2. The ADC 36 of MDAC$_1$ operates during the pulse of CLK2 and preferably latches the digital output on the falling edge of CLK2, thereby giving $V_{s/h}$ time to settle to the analog equivalent of N bit accuracy. Therefore, the tolerance of the SHA 14 is the analog equivalent of one LSB. MDAC$_1$ generates and holds the residue output $V_{res1}$ during CLK1. MDAC$_2$ samples $V_{res1}$ during CLK1 and latches its digital output at the end of CLK1, or on the falling edge of CLK1, thereby giving $V_{res}$ time to settle to the analog equivalent of N−1 bit accuracy. MDAC$_2$ generates and holds $V_{res2}$ during CLK2. The last stage 30 latches its digital output at the end of CLK2, or on the falling edge of CLK2, thereby giving $V_{res2}$ time to settle to the analog equivalent of N−2 bit accuracy.

Referring to FIG. 14, the conventional digital logic correction (DLC) circuit 44 will be described. The traditional DLC circuit 44 of an N-bit pipeline A/D converter 10 has a series of delays, or shift registers, to delay the digital output of each MDAC stage 18 and the last stage 66 so that their respective digital outputs can be combined as illustrated in FIG. 4. Each delay is provided with a digital input 164 and a digital output 166. It is noted that for simplicity and clarity the illustrated DLC circuit 44 in FIG. 14 shows multiple digital outputs (labeled with the $b_{m1}$ and $b_{m0}$ convention discussed above) of each digital output producing stage fed through one series of delays 160. However, in actual implementation separate series of delays 160 are required for each digital output bit for each stage. The number of digital outputs per A/D converter 10 stage will be referred to herein as B-bits per stage. The total number of delays 160 required by the conventional DLC circuit 44 of an N-bit pipeline A/D converter 10 where each stage of the A/D converter 10 has B digital output bits can be computed by the following equation.

$$\text{Number of Delays} = B(1 + 2 + \ldots + N) = B(N+1)\left(\frac{N}{2}\right)$$

Each delay is provided with a clock input 168 and a reset input (not shown). The same clock signal is applied to a clock input 168 of each delay 160 in the DLC circuit 44. However, as illustrated in FIG. 14, every other delay 160 for any particular A/D converter 10 stage has an inverted clock input 168. Therefore, the digital data output of each A/D converter 10 stage is delayed twice for each clock period. A 10-bit A/D converter 10 is illustrated in FIG. 14. Therefore, the digital output of MDAC$_1$ is delayed a total of nine times or 4.5 clock cycles. After the digital outputs of each stage have been delayed, they are combined as described above and illustrated in FIG. 4 by an adder 168. The adder 168 outputs the digital representation of the analog input signal, or $D_{OUT}$. The example 10-bit A/D converter 10 requires a total of ninety delays 160.

Should additional information be desired regarding conventional pipeline A/D converters, attention is directed to Stephen H. Lewis et al., "A Pipelined 5-Msample/s 9-bit Analog-to-Digital Converter," IEEE J. Solid-State Circuits, vol. Sc-22, no. 6, pages 954–961, December 1987; Stephen H. Lewis et al., "A 10-b 20-Msample/s Analog-to-Digital Converter," IEEE J. Solid-State Circuits, vol. 27, no. 3, pages 351–358, March 1992; Thomas B. Cho et al., "A 10 b, 20 Msample/s, 35 mW Pipeline A/D Converter," IEEE J. Solid-State Circuits, vol. 30, no. 3, pages 166–172, March 1995; Krishnaswamy Nagaraj et al., "A 250-mW, 8-b, 52-Msample/s Parallel-Pipelined A/D Converter with Reduced Number of Amplifiers," IEEE J. Solid-State Circuits, vol. 32, no. 3, pages 312–320, March 1997; and Yuh-Min Lin et al., "A 13-b 2.5-MHZ Self-Calibrated Pipelined A/D Converter in 3-µm CMOS," IEEE J. Solid-State Circuits, vol. 26, no. 4, pages 628–636, April 1991, each of which are incorporated by reference in their entireties.

SUMMARY OF THE INVENTION

The present invention provides a digital logic correction (DLC) circuit for a pipeline analog to digital (A/D) converter. The A/D converter having a plurality of stages, each stage producing at least a pair of digital output bits from which a digital representation of an analog input signal can be obtained. The DLC circuit has an adder, the adder having a plurality of inputs and an output. The DLC circuit has a plurality of digital delay sets, each digital delay set comprising at least one digital delay, an input of the digital delay set receiving a corresponding digital output bit and an output of the delay set providing a delayed digital output bit to a respective adder input. The DLC circuit has a clock generator, the clock generator providing clock signals to the DLC circuit to synchronize the arrival of the output of each digital delay set at the adder inputs during a data-valid-period. A primary clock signal is applied to the digital delay sets for every other stage. A secondary clock signal is applied to the remaining digital delay sets. The timing of the primary and secondary clock signals being effective to delay the digital output bits of each stage via the respective digital delay sets to cause the digital output bits to arrive at the adder inputs during the data-valid-period so that the adder produces the digital representation of the analog input signal at the adder output.

BRIEF DESCRIPTION OF DRAWINGS

These and further features of the present invention will be apparent with reference to the following description and drawings, wherein.

DISCLOSURE OF INVENTION

Figure 1:
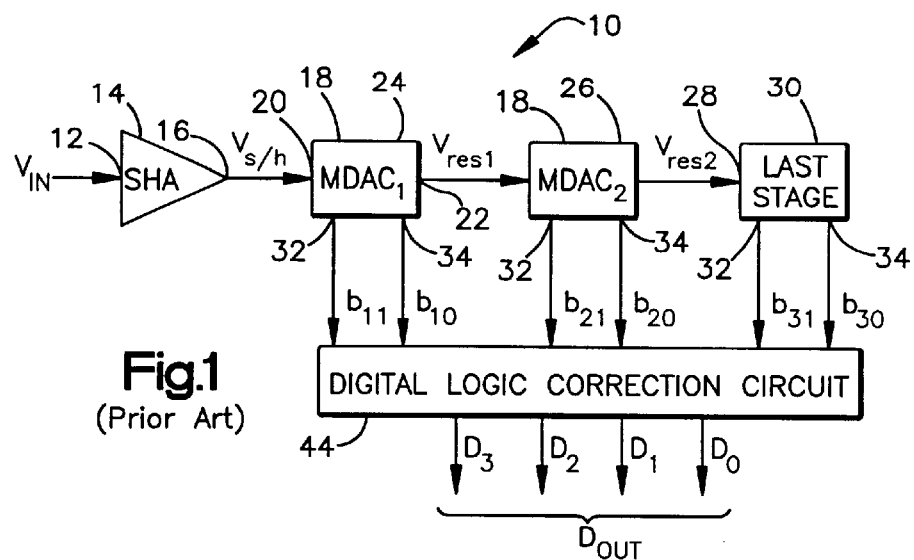
FIG. 1 is a block diagram of a conventional 4-bit pipeline analog to digital (A/D) converter.

In the detailed description which follows, identical components have been given the same reference numerals, regardless of whether they are shown in different embodiments of the present invention. In order to clearly and concisely illustrate the present invention, the drawings may not necessarily be to scale and certain features may be shown in somewhat schematic form.

Figure 6:
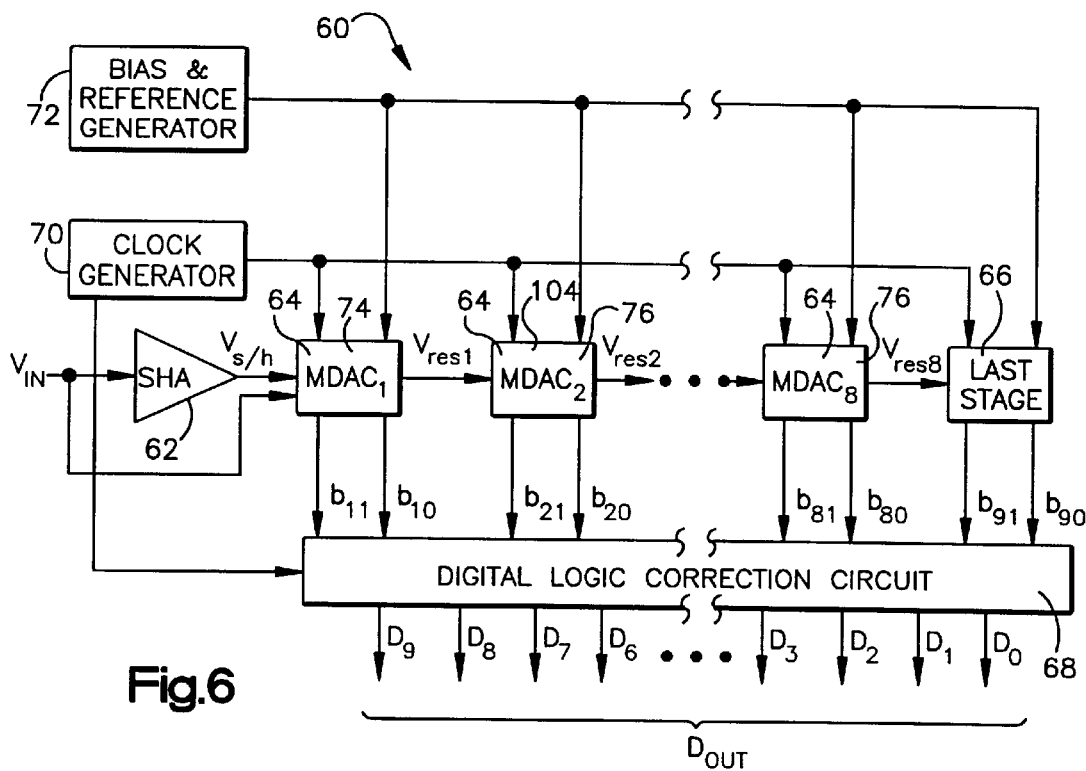
FIG. 6 is a block diagram of a 10-bit pipeline A/D converter according to one aspect of the invention.

Referring to FIG. 6, an analog to digital (A/D) converter 60 according to the present invention is illustrated. The A/D converter 60 converts an analog electrical input signal ($V_{IN}$) into a digital representation of the analog signal ($D_{OUT}$). The illustrated example is a 10-bit A/D converter, but it should be understood that a resolution of more or less bits is easily implemented with the addition or removal of converter stages. Therefore, the resolution of the A/D converter will sometimes be referred to as an N-bit-A/D converter, where N represents the number of digital output bits. The illustrated example A/D converter 60 has a sampling rate of 40 MHZ. Other sampling rates, such as 25–250 Mhz, can also be used.

Similar to the A/D converter 10 illustrated in FIG. 1, the A/D converter 60 has a sample-and-hold amplifier (SHA) 62, a series of analog signal converter stages also referred to as multiplying digital to analog converters (MDAC) 64 labeled $MDAC_1$ through $MDAC_8$, or generically $MDAC_m$, a last stage 66, and a digital logic correction circuit 68. In addition, the A/D converter 60 is provided with a clock generator 70 and a bias and reference voltage generator 72. The bias and reference generator 72 generates appropriate bias currents and voltage references for each of the various stages of the A/D converter 60. The clock generator 70 generates four clock pulse signals, referred to herein as a first clock pulse signal, or CLKA, a second clock pulse signal, or CLKB, a third clock pulse signal, or CLK1, and a fourth clock pulse signal, or CLK2. The clock generator 70 also generates early-falling versions of these clock pulse signals, referred to herein as CLKA', CLKB', CLK1' and CLK2'. The load and driving ability of all of the clock lines are preferably the same so as to help maintain the nonoverlapping characteristic of the clock signals. The timing of the A/D converter 60 is discussed in more detail below. $MDAC_1$ (reference numeral 74) has a different configuration than $MDAC_2$ through $MDAC_m$ (reference numeral 76). $MDAC_2$ through $MDAC_m$ each have the same configuration.

Figure 7:
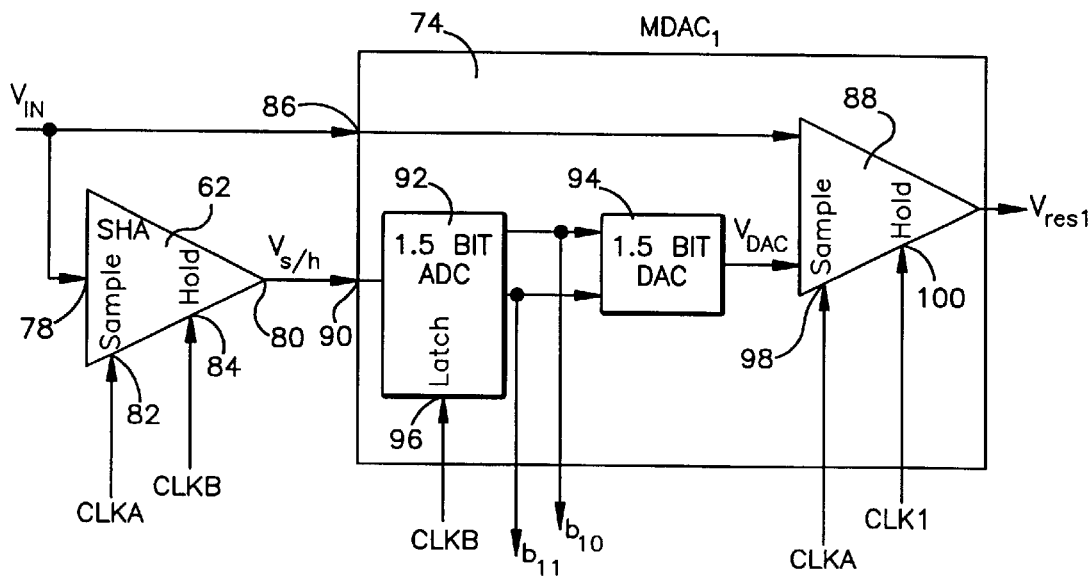
FIG. 7 is a block diagram of a sample-and-hold amplifier (SHA) stage and a first multiplying digital to analog converter (MDAC) according to the A/D converter illustrated in FIG. 6.

With reference to FIG. 7, the general operation of the A/D converter 60 will be described. Specific details of the A/D converter 60 operation will be discussed in greater detail below. It is noted, however, that the digital output of the MDACs as illustrated and described is exemplary and MDACs having resolution higher or lower than 1.5 bits can be used with similar results. $MDAC_1$ uses $V_{s/h}$ to generate $b_1$ and $b_{10}$. However, $MDAC_1$ does not use $V_{s/h}$ directly in a residue calculation. Rather, $MDAC_1$ uses $V_{IN}$ directly in the residue calculation operation. Since $V_{s/h}$ does not participate directly in the residue calculation, $V_{s/h}$ does not require the analog voltage equivalent of N-bit accuracy. This means that the tolerance of the SHA 62 can be greater than one LSB. In other words, $V_{s/h}$ has a relaxed accuracy requirement. As will be more fully explained below, if any error contained in $V_{s/h}$ plus the threshold offset of the ADC of $\text{MDAC}_1$ is kept within $V_r/4$, then the digital correction logic circuit 68 can recover a valid $D_{OUT}$. It is noted that the residue output of $\text{MDAC}_1$ should be accurate within the analog equivalent of N−1 bits. However, the difficult to achieve N bit accuracy of the SHA 62 has been eliminated, thereby helping to increase A/D converter 60 speed, reduce power consumption and reduce integrated circuit size requirements while also maintaining the overall accuracy of the A/D converter 60.

With continued reference to FIG. 7, the SHA 62 and $\text{MDAC}_1$ will be discussed in greater detail. The SHA 62 preferably has unity gain. $V_{IN}$ is input into an analog signal input 78 of the SHA 62. The SHA 62 samples the analog input signal ($V_{IN}$) and holds the sampled voltage, or $V_{s/h}$, for $\text{MDAC}_1$ at an SHA output 80. It is noted that $V_{IN}$, $V_{s/h}$ and the residue voltage ($V_{res}$) for each MDAC 64 are self referenced (i.e., differential) and, accordingly, are each carried across a pair of conductors. Alternatively, $V_{IN}$, $V_{s/h}$ and $V_{res}$ can be single-ended and carried on a single conductor referenced to a ground.

Figure 8:
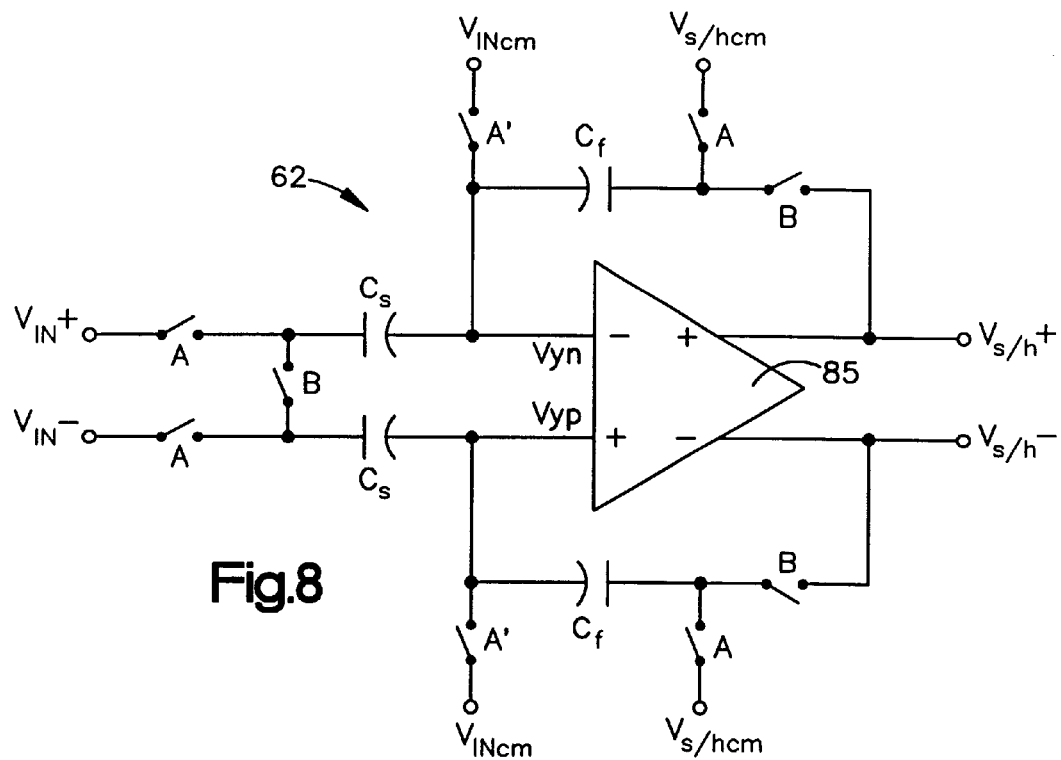
FIG. 8 is a circuit diagram of the SHA according to the A/D converter illustrated in FIG. 6.

The SHA 62 has a sample clock input 82 for receiving the CLKA signal from the clock generator 70 and a hold clock input 84 for receiving the CLKB signal from the clock generator 70. The SHA 62 can be implemented with a switched capacitor circuit using a fully differential operational amplifier 85 as illustrated in FIG. 8. Switches A and B are implemented with CMOS transmission gates controlled by clock signals CLKA and CLKB respectively. Considered together, CLKA and CLKB form a two-phase nonoverlapping clock, the details of which will be more fully discussed below. Switch A' is controlled by the early falling version of CLKA, or CLKA'. The fully differential operational amplifier 85 has an input offset voltage ($V_{os}$), an input parasitic capacitance for each input node ($C_p$) and a DC differential gain ($A_o$). It is noted that the symbols cm, + and − are added to the suffixes of certain voltages in FIG. 8 and the following equations. One skilled in the art will appreciate that cm stands for common mode and that the + and − symbols distinguish between the potentials on the individual conductors of the conductor pairs for $V_{IN}$, $V_{s/h}$ and $V_{res}$. It is noted that if the accuracy requirement of the SHA 62 is not relaxed as described herein, the capacitors in the SHA 62, labeled $C_s$ and $C_f$, need to be large enough so that the total device noise effect (i.e., KT/C noise plus opamp noise) is considerably smaller than quantization noise. In that case, 0.45 pf capacitors implemented with 20 $\mu$m×20 $\mu$m poly-poly capacitors in 0.35 $\mu$m double poly technology are used for capacitors $C_s$ and $C_f$ for a 10-bit A/D converter. However, the present invention can use smaller capacitors for $C_s$ and $C_f$. At phase B, a stable input value ($V_{yn}$) of the operational amplifier is satisfied by the following equation:

$$V_{yn} = V_{INcm} + \left(\frac{V_{slh^+} + V_{slh^-}}{2} - V_{slhcm}\right)\left(\frac{C_f}{(C_f + C_p)}\right) - \frac{V_{os}}{2} - \frac{V_{slh^+} - V_{slh^-}}{2A_o}$$

At phase B, a stable output value of the operational amplifier is expressed by the following equation:

$$V_{slh^+} - V_{slh^-} = \frac{\left(\frac{(C_s + C_f)}{C_f}\right)(V_{IN^+} - V_{IN^-}) - \left(1 + \frac{C_s}{C_f} + \frac{C_p}{C_f}\right)(V_{os})}{1 + \left(\frac{1}{A_o}\right)\left(1 + \frac{C_s}{C_f} + \frac{C_p}{C_f}\right)}$$

Figure 2:
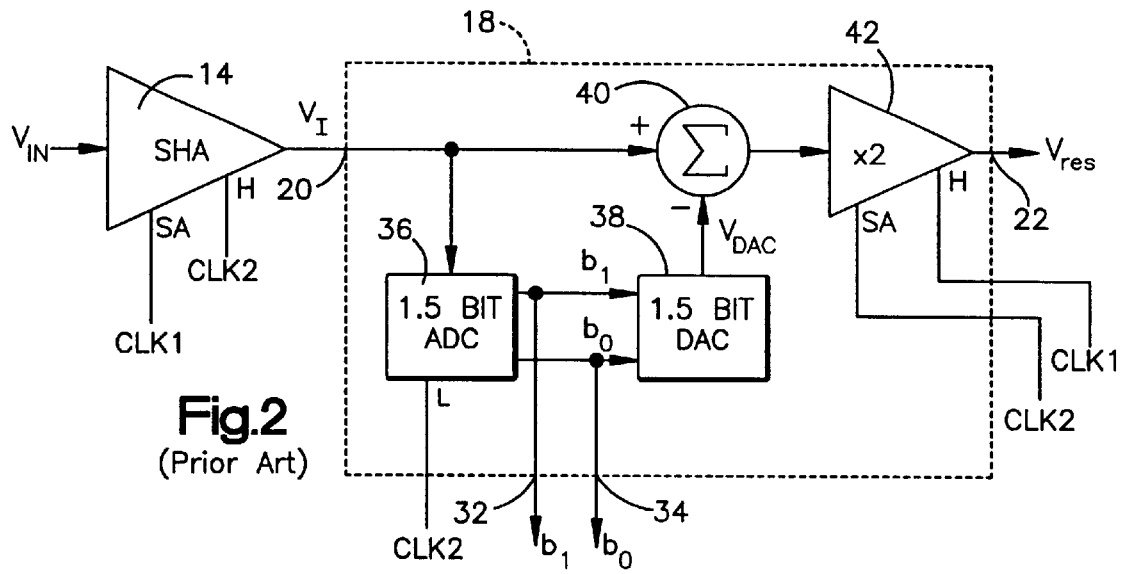
FIG. 2 is a block diagram of a conventional multiplying digital to analog converter (MDAC) representing a stage of the conventional A/D converter.
Figure 3:
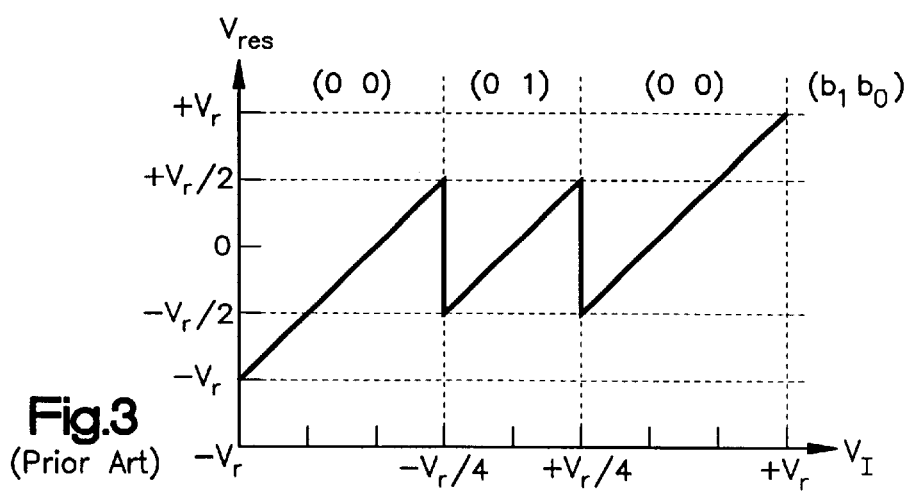
FIG. 3 is a graph of the characteristics of the MDAC illustrated in FIG. 2.

Referring back to FIG. 7, $\text{MDAC}_1$ has an analog signal input 86 for directly receiving the analog input signal ($V_{IN}$). The analog signal input 86 is connected to an input of a residue amplifier 88 and is used to calculate the a residue signal for the $\text{MDAC}_1$, or $V_{res1}$. $\text{MDAC}_1$ is also provided with a sample-and-hold voltage input 90 connected to the SHA output 80 for receiving $V_{s/h}$. $\text{MDAC}_1$ has a flash type 1.5-bit analog to digital converter (ADC) 92 similar to the ADC 36 used for the MDAC 18 illustrated in FIG. 2. The ADC 92 has an input connected to the sample-and-hold voltage input 90 and converts $V_{s/h}$ into two bits, $b_1$ and $b_0$ in accordance with the definitions recited in TABLE 1 above. Once $b_1$ and $b_0$ are generated by the ADC 92, they are output from $\text{MDAC}_1$ to the digital logic correction circuit 68 and also input into a 1.5-bit digital to analog converter (DAC) 94. The ADC 92 has a latch clock input 96 for receiving the CLKB signal generated by the clock generator 70. The DAC 94 is similar to the DAC 38 used for the MDAC 18 illustrated in FIG. 2. The DAC 94 converts $b_1$ and $b_0$ into $V_{DAC}$ in accordance with the definitions recited in TABLE 2 above. The DAC 94 outputs $V_{DAC}$ which is received by a second input of the residue amplifier 88 for use in the calculation of $V_{res1}$. The residue amplifier is provided with a sample clock input 98 for receiving the CLKA signal and a hold clock input 100 for receiving the CLK1 signal.

Figure 9:
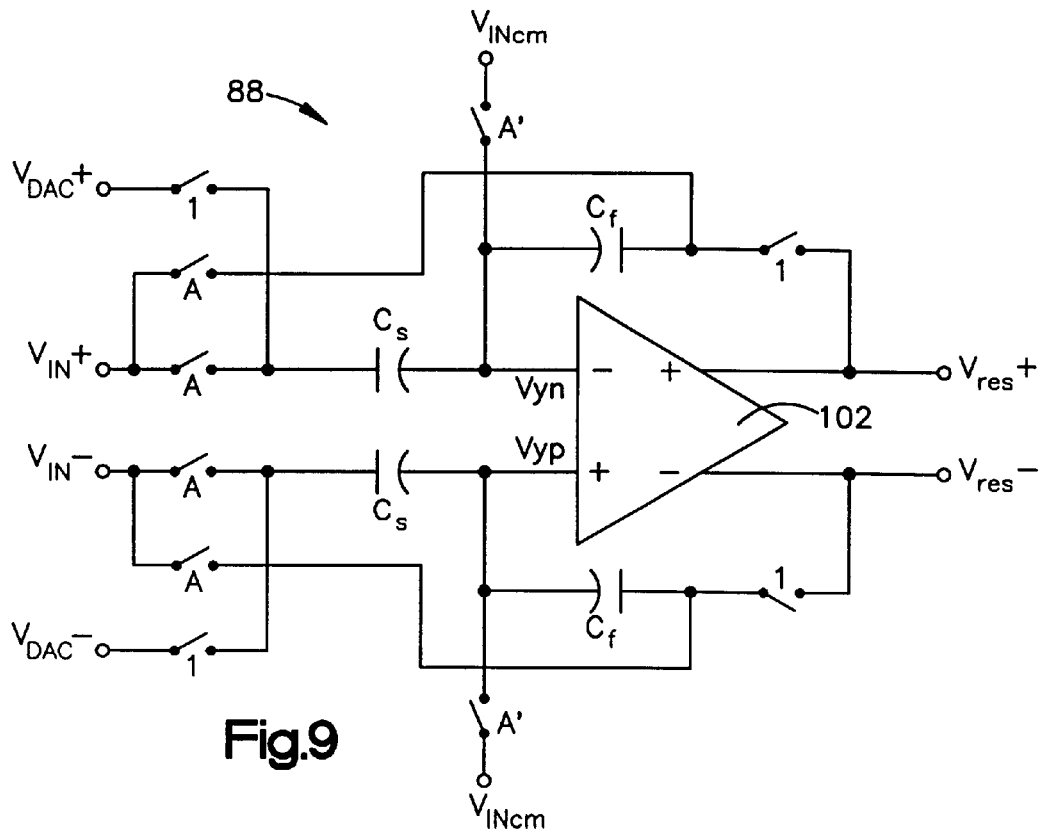
FIG. 9 is a circuit diagram of a residue amplifier portion of the first MDAC according to the A/D converter illustrated in FIG. 6.

With additional to FIG. 9, the residue amplifier 88 is a differential switched capacitor voltage doubler which uses a fully differential operational amplifier 102. The operational amplifier 102 is preferably a telescopic opamp with a gain-enhanced cascade load to provide high gain (e.g., 80 dB) and fast settling. It is desirable that the accuracy of $V_{res1}$ for $\text{MDAC}_1$ is $\frac{1}{2}^{N-1}$ to achieve a differential non-linearity (DNL) of less than one half of a least significant bit (i.e., DNL<½LSB). It is noted that the capacitors in the residue amplifier 88, labeled $C_s$ and $C_f$, are preferably large enough so that the total device noise effect (i.e., KT/C noise plus opamp noise) is considerably smaller than quantization noise. Preferably, 0.45 pf capacitors are used for capacitors $C_s$ and $C_f$. The 0.45 pf capacitors can be implemented with 20 $\mu$m×20 $\mu$m poly-poly capacitors. Switches A and 1 are implemented with CMOS transmission gates controlled by clock signals CLKA and CLK1 respectively. Switch A' is controlled by the early falling version of CLKA, or CKLA'. The amplifier 102 has an input offset voltage ($V_{os}$), an input parasitic capacitance for each input node ($C_p$) and a DC differential gain ($A_o$). An example differential gain $A_o$ for a 10-bit A/D converter 60 is at least 4000. It is noted that the symbols cm, + and − are added to the suffixes of certain voltages in FIG. 9 and the following equations. One skilled in the art will appreciate that cm stands for common mode and that the + and − symbols distinguish between the potentials on the individual conductors of the conductor pairs for $V_{IN}$, $V_{s/h}$ and $V_{res}$. At phase 1, a stable input value ($V_{yn}$) of the amplifier 102 is satisfied by the following equation:

$$V_{yn} = V_{INcm} + X\left(\frac{C_f}{(C_s + C_f + C_p)}\right) - \frac{V_{os}}{2} + \frac{V_{res}^+ - V_{res}^-}{2A_o}$$

where $$X = \left(\frac{C_f(V_{res}^+ + V_{res}^-)}{2} + \frac{C_s(V_{DAC}^+ + V_{DAC}^-)}{2} - \frac{(C_f + C_s)(V_{IN}^+ + V_{IN}^-)}{2}\right)$$

At phase 1, a stable output value of the amplifier 102 is expressed by the following equation:

$$V_{res}^+ - V_{res}^- = \frac{\left(\frac{(C_s + C_f)}{C_f}\right)(V_{IN}^+ - V_{IN}^-) - \left(1 + \frac{C_s}{C_f} + \frac{C_p}{C_f}\right)(V_{os}) + \left(\frac{C_s}{C_f}\right)(V_{DAC}^+ - V_{DAC}^-)}{1 + \left(\frac{1}{A_o}\right)\left(1 + \frac{C_s}{C_f} + \frac{C_p}{C_f}\right)}$$

Referring back to FIG. 7, MDAC$_1$ uses $V_{s/h}$ only to generate b$_{11}$ and b$_{10}$ and not directly in the calculation of V$_{res1}$. Rather, the MDAC$_{12}$ directly uses the analog input signal V$_{IN}$ in the calculation of the residue value V$_{res1}$. The SHA 62 no longer requires the analog voltage equivalent of N-bit accuracy, or a tolerance of one LSB, since the SHA 62 stage is removed from the residue generation process. The accuracy requirement for V$_{s/h}$ is relaxed from the difficult to achieve analog voltage equivalent of N-bit resolution to a tolerance correctable using the digital logic correction circuit. Therefore, the accuracy, or tolerance, of the SHA 62 stage can be expressed as being an error which is less than V$_r$/4, where Vr is the full scale range of the ADC 92 of MDAC$_1$. It is noted that full scale range of the ADC 92 of MDAC$_1$ is commensurate with the full scale range of V$_{IN}$. Therefore, the tolerance of the SHA 62 is ±25% of V$_{IN}$, or alternatively expressed as a voltage output accuracy of an analog voltage equivalent of N−1 bits. As one skilled in the art will appreciate, reducing the accuracy required of the SHA 62 provides certain advantages. It greatly reduces the need for fast settling times in the SHA 62, making the design of the SHA 62 is easier to implement. Also, the SHA 62 can be implemented with a circuit having reduced power consumption and chip area.

Figure 10:
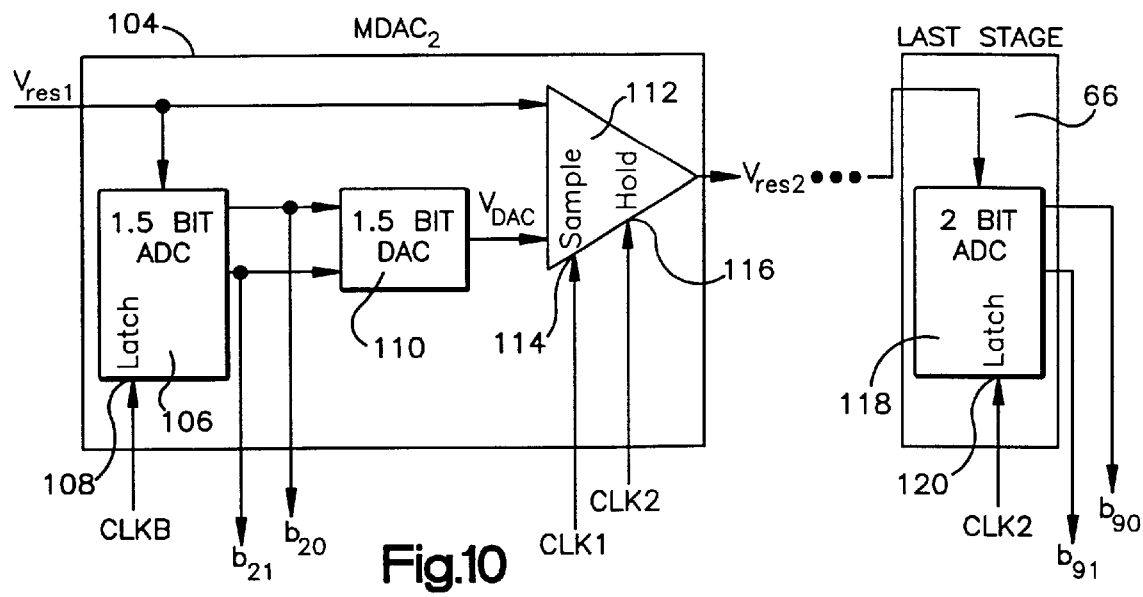
FIG. 10 is a block diagram of a second MDAC and a last stage according to the A/D converter illustrated in FIG. 6.

Referring to FIG. 10, a second MDAC$_1$ or MDAC$_2$ (reference numeral 104), and the last stage 66 are illustrated. The MDAC$_2$ is operationally the same as the MDAC 18 (FIG. 2) found in the A/D converter 10 illustrated in FIG. 1. In addition, all of the MDACs 76 after the first MDAC, or MDAC$_1$, are identical with the exception of the input clock waveforms applied to the MDACs 76 to establish the timing. The clock signals applied to the various stages is discussed in more detail below. Therefore, discussion of the MDACs 76 in the pipeline subsequent to MDAC$_1$, will be limited to the following discussion of MDAC$_2$. MDAC$_2$ provides a flash type 1.5-bit ADC 106 having two comparators and a latch clock input 108. The ADC 106 converts the residue voltage, V$_{res}$, of the prior MDAC 64 into two output bits b$_{m1}$ and b$_{m0}$ as discussed above. The output bits b$_{m1}$ and b$_{m0}$ are input into the digital error correction circuit for calculation of the digital output, D$_{OUT}$. The output bits b$_{m1}$ and b$_{m0}$ are also input into a 1.5-bit DAC 110 provided by the MDAC$_2$ for generating V$_{DAC}$ as discussed above. The MDAC$_2$ provides a residue amplifier 112 which is substantially the same as the residue amplifier 88 for MDAC$_1$. The residue amplifier 112 calculates a residue voltage, V$_{resm}$, for the next stage of the A/D converter 60 using the residue voltage of the prior stage and V$_{DAC}$ as discussed above. The residue amplifier 112 has a sample clock input 114 and a hold clock input 116.

With continued reference to FIG. 10, the last stage 66 is operationally the same as the last stage 30 (FIG. 1) for the A/D converter 10. The last stage 66 provides a flash type 2-bit ADC 118 having three comparators and a latch clock input 120. The ADC 118 converts the residue voltage, V$_{res}$, of the prior MDAC 64 into two output bits b$_{m1}$ and b$_{m0}$ as discussed above. The output bits b$_{m1}$ and b$_{m0}$ are input into the digital error correction circuit for calculation of the digital output, D$_{OUT}$.

Figure 11:
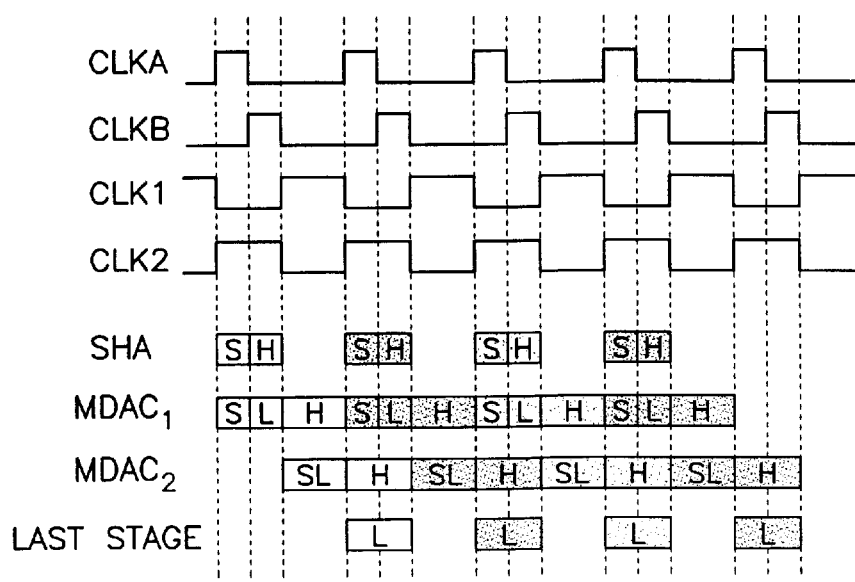
FIG. 11 is a timing diagram of a 4-bit pipeline A/D converter for use with the A/D converter illustrated in FIG. 6.
Figure 13:
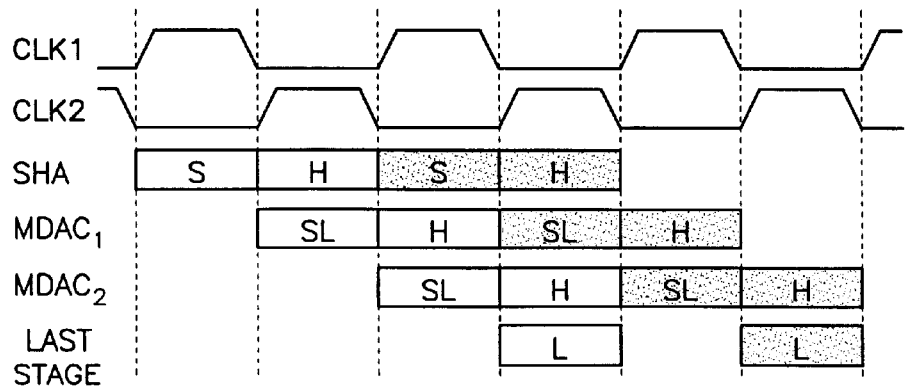
FIG. 13 is a conventional timing diagram of the A/D converter illustrated in FIG. 1.

Referring now to FIG. 11, the timing of an example 4-bit A/D converter constructed in accordance with the present invention will now be described. Similar to the 10-bit A/D converter illustrated in FIG. 6, the example 4-bit A/D converter has the SHA stage 62, the first MDAC$_1$, the second MDAC$_2$, and the last stage 66, but does not have the additional six intermediate MDAC stages 76, or MDAC$_3$ through MDAC$_8$. The timing of a 4-bit A/D converter, rather than a higher resolution A/D converter, is described for simplicity and clarity. The same timing is used for a higher N-bit converter, but the clock phase for the sample and hold of the third and subsequent MDACs 76 alternate from stage to stage. More specifically, the third and subsequent MDACs 76 alternately use CLK1 and CLK2 for the sample/latch operation and the hold operation so that the sample/latch of the MDAC 64 coincides with the hold of the previous MDAC 76, as is illustrated for MDAC$_1$ and MDAC$_2$ in FIGS. 11 and 13.

Waveforms for the four clock pulses, CLKA, CLKB, CLK1 and CLK2 are illustrated in the top portion of FIG. 11. Considered together, CLKA and CLKB form a two-phase nonoverlapping clock. CLKA effectively has about a 25% duty cycle. CLKB also effectively has about a 25% duty cycle but lags CLKA by 90°. Considered together, CLK1 and CLK2 form a two-phase nonoverlapping clock. CLK1 effectively has about a 50% duty cycle but lags CLKA by 180°. CLK2 also effectively has about a 50% duty cycle but lags CLK1 by 180°. It is noted that for simplicity and clarity, the four clock pulse signals are shown in FIG. 11 as square waves. However, the clock pulses preferably have sloping leading and falling edges as illustrated for the clock signals shown in FIG. 13.

The sample, hold and latch operations of the SHA stage 62, the first MDAC$_1$, the second MDAC$_2$, and the last stage 46 are illustrated in the bottom portion of FIG. 11. The different shading in the timing diagram represents the pipeline conversion process on a series of four analog input samples as the samples pipeline through all of the stages.

The SHA 62 samples the analog input signal, V$_{IN}$, during CLKA and conducts a hold operation during CLKB. Therefore, the SHA 62 produces V$_{s/h}$ within an acceptable tolerance by the end of the pulse of CLKB. In other words, V$_{s/h}$ has settled to the analog equivalent of N−1 bit accuracy within a half of a duty cycle.

Using V$_{s/h}$, the ADC 92 of MDAC$_1$ operates and generates its digital output, b$_{11}$ and b$_{10}$, during the pulse of CLKB. Preferably, the ADC 92 latches the digital output on the falling edge of CLKB, thereby giving V$_{s/h}$ the maximum possible time to settle. It should be appreciated that the latch operation of MDAC$_1$ is thereby accomplished within a half of a duty cycle.

Simultaneously to the sampling conducted by the SHA 62, MDAC$_1$ also samples the input signal, V$_{IN}$, during CLKA. This is done to allow all of the stages to convert the same sample of $V_{IN}$ at the appropriate time so that the respective output bits of each stage, $b_1$ and $b_0$, are cascaded to the digital logic correction circuit 72 at the correct time to be combined together to produce a digital output signal, $D_{OUT}$, for the same input sample.

$MDAC_1$ generates and holds the residue output $V_{res1}$ during CLK1. $MDAC_2$ samples $V_{res1}$ during CLK1 and latches its digital output at the end of CLK1, preferably on the falling edge of CLK1, thereby giving $V_{res1}$ time to settle to N−1 bit accuracy. $MDAC_2$ generates and holds $V_{res2}$ during CLK2. The last stage 66 latches its digital output at the end of CLK2, or on the falling edge of CLK2, thereby giving $V_{res2}$ time to settle to N−2 bit accuracy. The last stage 66 does not conduct sample and/or hold operations since the last stage 66 does not generate a residue output. It should be appreciated that the overall conversion of a sample of $V_{IN}$ to $D_{OUT}$ is advanced by a half duty cycle in the A/D converter 60 as compared to the conventional A/D converter 10. Therefore, the A/D converter 60 derives a $D_{OUT}$ for each sampled $V_{IN}$ faster than the A/D converter 10. For example, a four bit A/D converter 60 according to the present invention is 25% faster that a conventional four bit A/D converter 10 since the four bit A/D converter 60 according to the present invention converts a $V_{IN}$ sample in 1.5 clock cycles and the four bit conventional A/D converter converts a $V_{IN}$ sample in two clock cycles.

Figure 4:
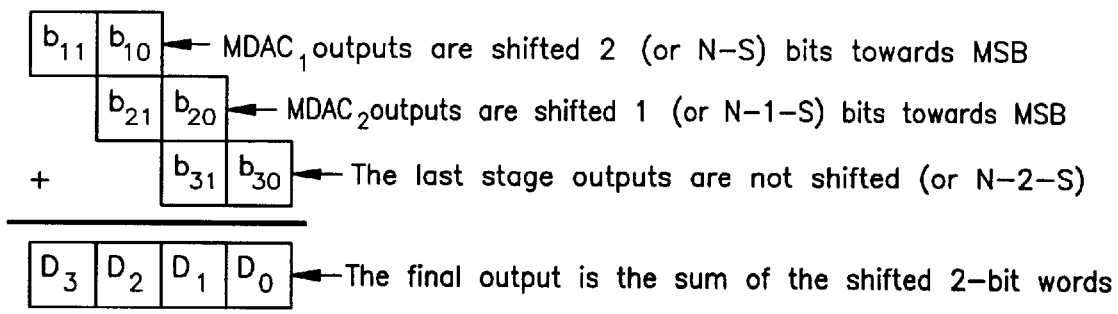
FIG. 4 is a depiction of a shifting operation of a digital error correction circuit portion of the conventional A/D converter.
Figure 5:
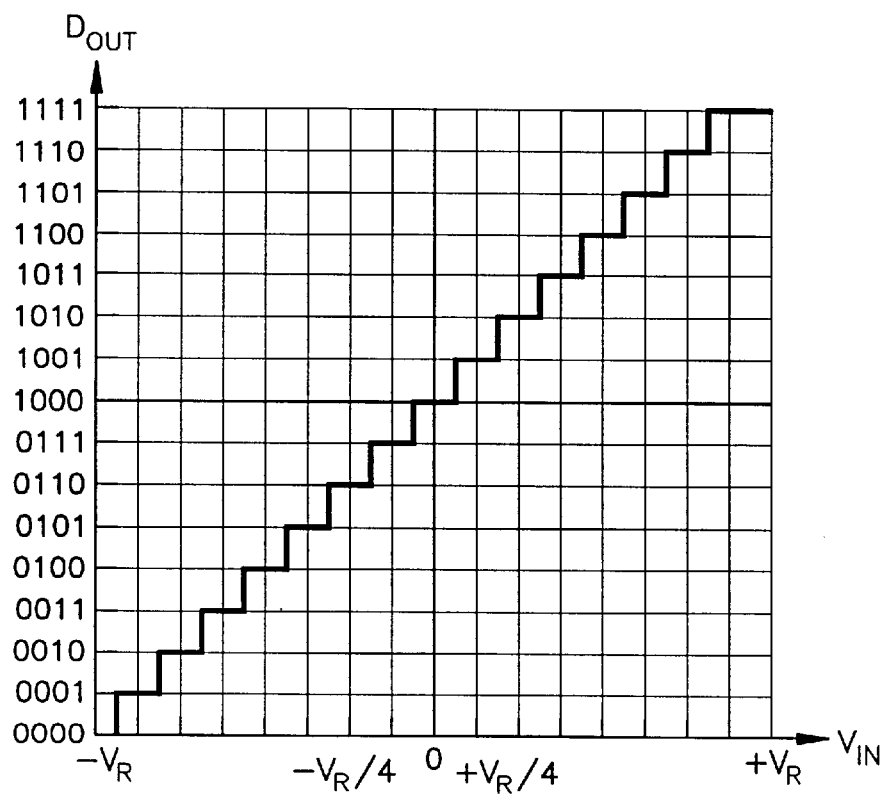
FIG. 5 is a graph of the characteristics of the A/D converter illustrated in FIG. 1.
Figure 15:
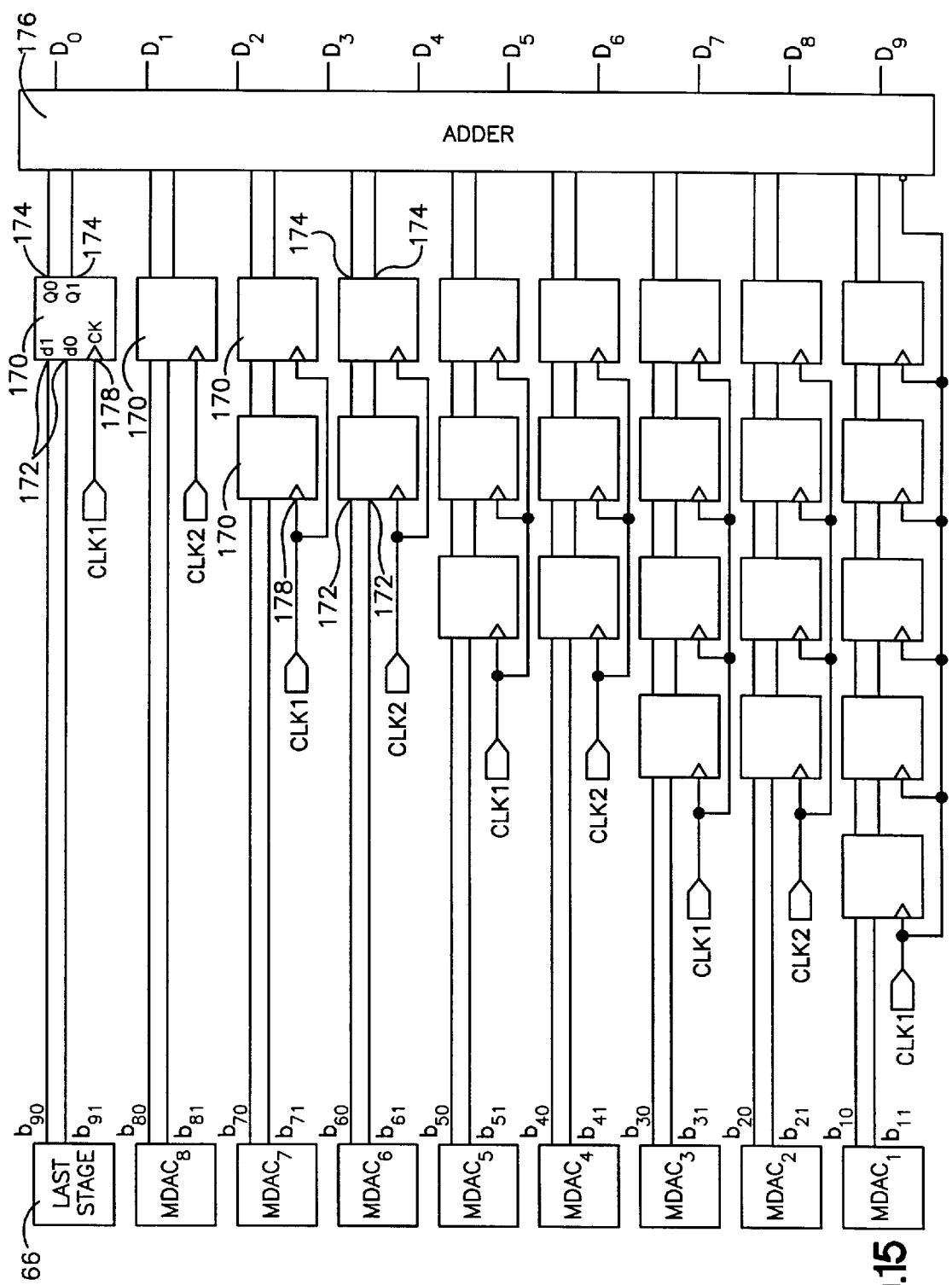
FIG. 15 is a block diagram of a digital logic correction (DLC) circuit according to the present invention for a 10-bit pipelined A/D converter.

Referring to FIG. 15, a digital logic correction (DLC) circuit 68 according to the present invention will now be described. The DLC circuit 68 can be used with the conventional A/D converter 10 (FIG. 1) or the A/D converter 60 (FIG. 6). The DLC circuit 68 delays, or shifts, the digital outputs of each stage of the A/D converter 60. In addition, the DLC circuit 68 combines the shifted digital outputs using an adder 176 as described in the foregoing sections and illustrated in FIG. 4. The adder 176 has a series of inputs and a series of outputs. The DLC circuit 68 is provided with a set, or chain, of delays 170 for each digital output producing stage of the A/D converter 60 (i.e., $MDAC_1$ through $MDAC_m$ and the last stage 66). The delays 170 in each set are connected in series and can be implemented with flip-flops as are well known in the art. Each series of delays 170 has a digital input 172 connected to the respective digital outputs of the digital output producing stages and an output 174 connected to respective inputs of the adder. It is noted that for simplicity and clarity the illustrated DLC circuit 68 in FIG. 15 shows multiple digital outputs (labeled with the $b_{m1}$ and $b_{m0}$ convention discussed above) of each digital output producing stage fed through the one series of delays 170. However, in most actual implementation a separate series of delays 170 is required for each digital output bit for each stage (i.e., each delay 170 has one input 172 and one output 174). Alternatively, delays 170 that delay more than one bit can be used.

Each delay 170 is also provided with a clock input 178. Beginning with $MDAC_1$, the clock inputs 178 of the delays 170 transmitting the output bits of $MDAC_1$ to the adder 176 receive CLK1. The delays 170 transmitting the digital output bits of $MDAC_2$ receive CLK2 at the clock inputs 178 of the delays 170. This pattern repeats, as illustrated in FIG. 15, where CLK1 and CLK2 alternate between each series of delays 170. More specifically, the clock pulse signal connected to the clock input 178 of any particular delay 170 is the opposite phase of the phase of the two phase nonoverlapping clock used to latch the digital output being transmitted by the delay 170. For example, as shown in FIG. 11, $MDAC_2$ latches its output on the falling edge of CLK1, therefore the series of delays 170 carrying the digital output of $MDAC_2$ to the adder 178 is provided with CLK2. In the timing of the A/D converter 60, $MDAC_1$ latches its digital output at the falling edge of CLKB which is coincident with the falling edge of CLK2. Therefore, the delays 170 carrying the digital output from $MDAC_1$ to the adder 176 are clocked with CLK1. The delays 170 preferably trigger on the rising edge of the their respective clock input signals. Each delay 170 is also provided with a reset input (not shown). The reset input of each delay 170 is connected to a reset clock, as is known in the art. More specifically, each delay is reset at the beginning of each data conversion process. As will be described in more detail below, the adder 176 is synchronized with CLK1.

Figure 16:
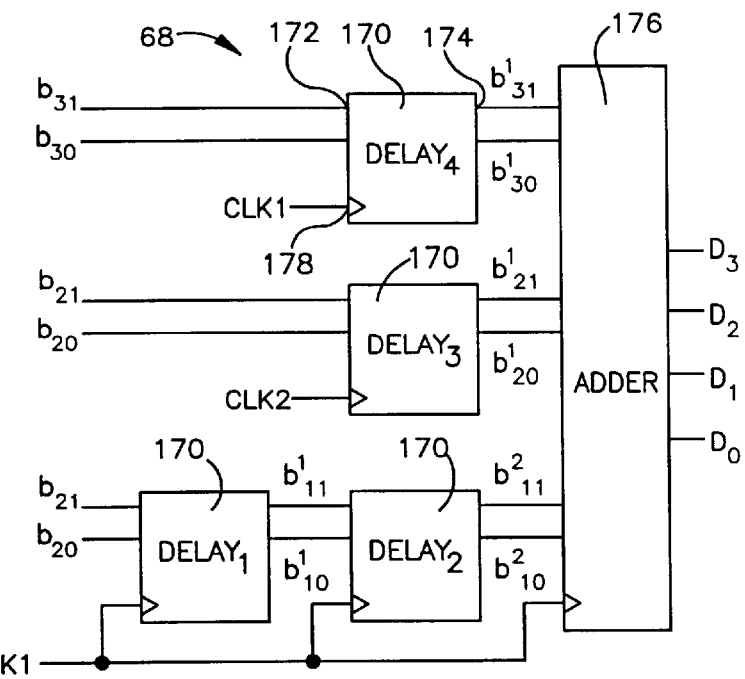
FIG. 16 is a block diagram of a DLC circuit according to the present invention for a 4-bit pipelined A/D converter.
Figure 17:
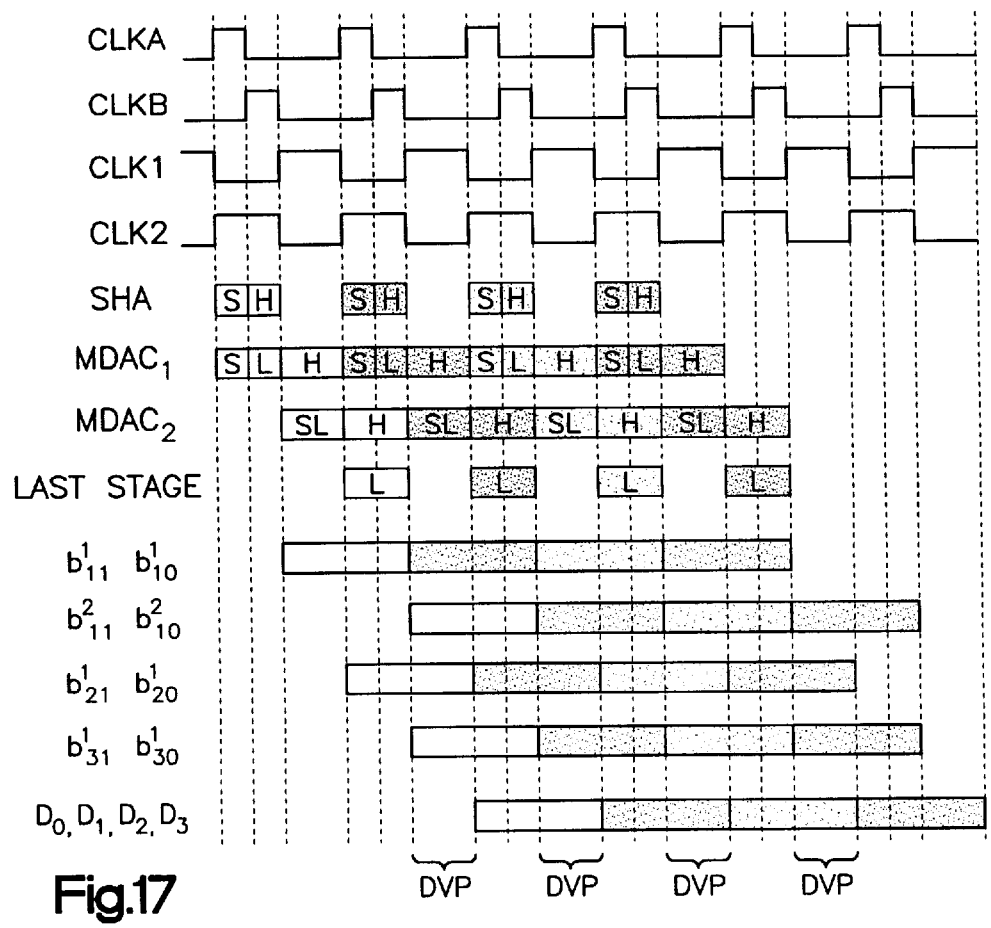
FIG. 17 is a timing diagram of a 4-bit pipelined A/D converter having the DLC circuit illustrated in FIG. 16.

Referring now to FIGS. 16 and 17, the timing of the DLC circuit 68 will be discussed in more detail. For clarity, FIG. 16 illustrates the DLC circuit 68 for a 4-bit A/D converter and FIG. 17 illustrates an associated timing diagram. $MDAC_1$ latches its digital output $b_{11}$ and $b_{10}$ at the falling edge of CLKB (which coincides with CLK2). The first delay unit 170, or $delay_1$, receiving $b_{11}$ and $b_{10}$ samples $b_{11}$ and $b_{10}$ at the rising edge of CLK1 and outputs a delayed version of $b_{11}$ and $b_{10}$, or $b^1_{11}$ and $b^1_{10}$ where the superscript indicates how many times the bits have been delayed. The second delay unit 170, or $delay_2$, receiving $b_{11}$ and $b_{10}$ samples $b^1_{11}$ and $b^1_{10}$ at the next rising edge of CLK1 and outputs $b^2_{11}$ and $b^2_{10}$. $MDAC_2$ latches its digital output $b_{21}$ and $b_{20}$ at the falling edge of CLK1. The first delay unit 170, or $delay_3$, receiving $b_{21}$ and $b_{20}$ samples $b_{21}$ and $b_{20}$ at the rising edge of CLK2 and outputs a delayed version of $b_{21}$ and $b_{20}$, or $b^1_{21}$ and $b^1_{20}$. The last stage 66 latches its digital output $b_{31}$ and $b_{30}$ at the falling edge of CLK2. The first delay unit 170, or $delay_4$, receiving $b_{31}$ and $b_{30}$ samples $b_{31}$ and $b_{30}$ at the rising edge of CLK1 and outputs a delayed version of $b_{31}$ and $b_{30}$, or $b^1_{31}$ and $b^1_{30}$.

The resultant inputs to the adder are $b^2_{11}$ and $b^2_{10}$, $b^1_{21}$ and $b^1_{20}$, and $b^1_{31}$ and $b^1_{30}$. As illustrated in FIG. 17, $b^1_{21}$ and $b^1_{20}$ arrive half a clock cycle earlier than the rest of the bits. A time, or time range, when all of the bits are valid for a given sample, or a data-valid-period (DVP), is the moment(s) during which all of the adder inputs represent the same sample of the analog input. The DVP is between the arrival of bits $b^2_{11}$, $b^2_{10}$, $b^1_{31}$ and $b^1_{30}$ at the rising edge of CLK1 and the arrival of the next sample of $b^1_{21}$ and $b^1_{20}$ bits at the rising edge of CLK2. The adder 176 outputs, or $D_0$, $D_1$, $D_2$ and $D_3$, are synchronized using the falling edge of CLK1 which is within the DVP. One skilled in the art will appreciate that it is possible to alter the clock signals used by the delays 170 to sample the bits and the clock signal used to synchronize the adder 176 during the DVP to achieve equivalent results. For example, CLK1 and CLK2 could be substituted for each other and/or the rising and falling edges could be substituted for each other.

Referring back to FIG. 15, the illustrated DLC circuit 68 is for a 10-bit A/D converter where each stage has two digital outputs. The DLC circuit 68 for this 10-bit A/D converter will require fifty delays 70. It is noted that the DLC circuit 68 can be adapted for an A/D converter having any number of digital output bits representing the analog input, or N. The DLC circuit 68 can also be used for the A/D converter 60 as illustrated in FIG. 6, a conventional A/D converter 10 as illustrated in FIG. 1 or with any other pipeline A/D converter. If the A/D converter using the DLC circuit 68 has an odd number of output bits N and each stage has B number of digital output bits and there are M number of stages producing a digital output (the A/D converter 60 of the present invention has one less digital output producing stage, M, than the number of output bits N), then the number of delays 170 can be computed using the following equation.

$$\text{Number of Delays} = B \cdot 2\left(1 + 2 + \ldots + \frac{M}{2}\right) = B\left(1 + \frac{M}{2}\right)\left(\frac{M}{2}\right)$$

If the number of digital output bits, N, is even, then the number of delays 170 can be computed using the following equation.

$$\text{Number of Delays} = B\left(2\left(1 + 2 + \ldots + \frac{M-1}{2}\right) + \frac{M+1}{2}\right)$$
$$= B\left(\left(1 + \frac{M-1}{2}\right)\left(\frac{M-1}{2}\right) + \frac{M+1}{2}\right)$$

Figure 14:
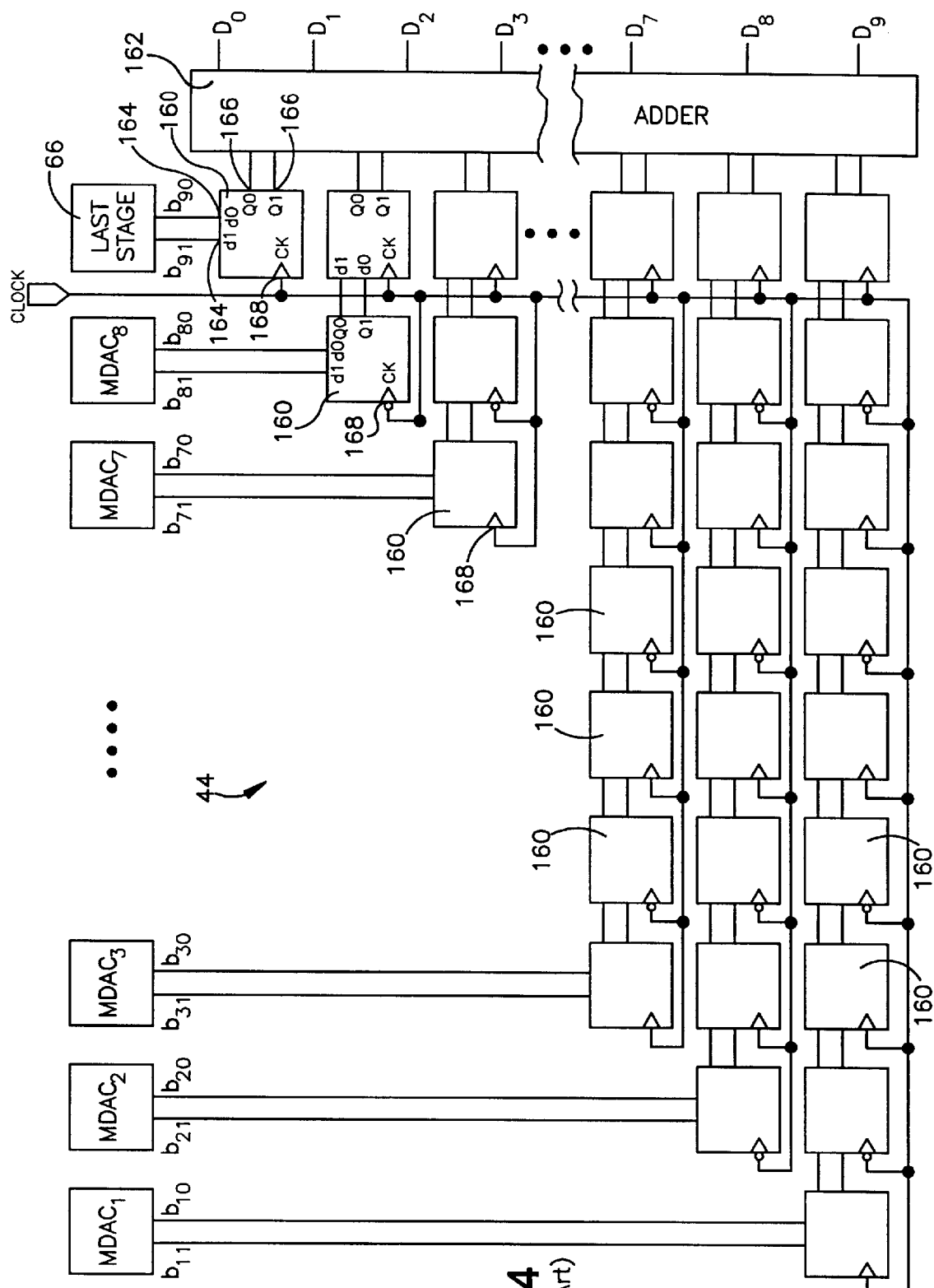
FIG. 14 block diagram of a conventional digital logic correction (DLC) circuit.

Each digital output producing stage of the A/D converter 60 and the conventional A/D converter 10, produces digital data bits during each clock cycle of the two phase nonoverlapping clock, also referred to herein as CLK1 and CLK2. The digital output of any one stage is inherently a half clock cycle ahead of the subsequent digital output producing stage. For example, if CLK1 and CLK2 have a period T, then the digital output of $MDAC_1$ is latched T/2, or a half clock cycle, before the digital output of $MDAC_2$ is latched. By delaying the digital output of each digital output producing stage by using the opposite clock as used to latch that digital output, the need to shift every bit of data by a half clock cycle for every stage in the pipeline, as illustrated in the conventional DLC circuit 44 in FIG. 14, is eliminated. Accordingly, fewer delays 170 per digital output producing stage are required. Reducing the number of delays reduces both the amount of hardware required by the DLC circuit 68 which in turn reduces the power required by the DLC circuit 68 and the noise generated by the DLC circuit 68. In addition, if the delays 170 are implemented with p/n transmission gates and a static inverter and the adder is implemented with a conventional adder as well known in the art, the silicon area for the DLC circuit 68 is 340 $\mu$m by 170 $\mu$m and the power consumption is less than 3 mW at 40 Msamples/second with a 3.3 V power supply. The output from each digital output producing stage is delayed an appropriate number of full or half clock cycles so that all of the digital outputs of all of the digital output producing stages arrive at the adder during a data-valid-period so that a correct $D_{OUT}$ can be derived.

The A/D converter 60 of the present invention is well suited for use in a variety of applications. For instance, the A/D converter 60 can be used as part of a memory circuit. In addition, the A/D 60 converter can be implemented with discrete components or as part of an integrated circuit. If the A/D converter 60 is implemented as part of an integrated circuit, the A/D converter 60 can be made using known integrated circuit manufacturing technology in a medium such as 0.35 $\mu$m CMOS.

Figure 12:
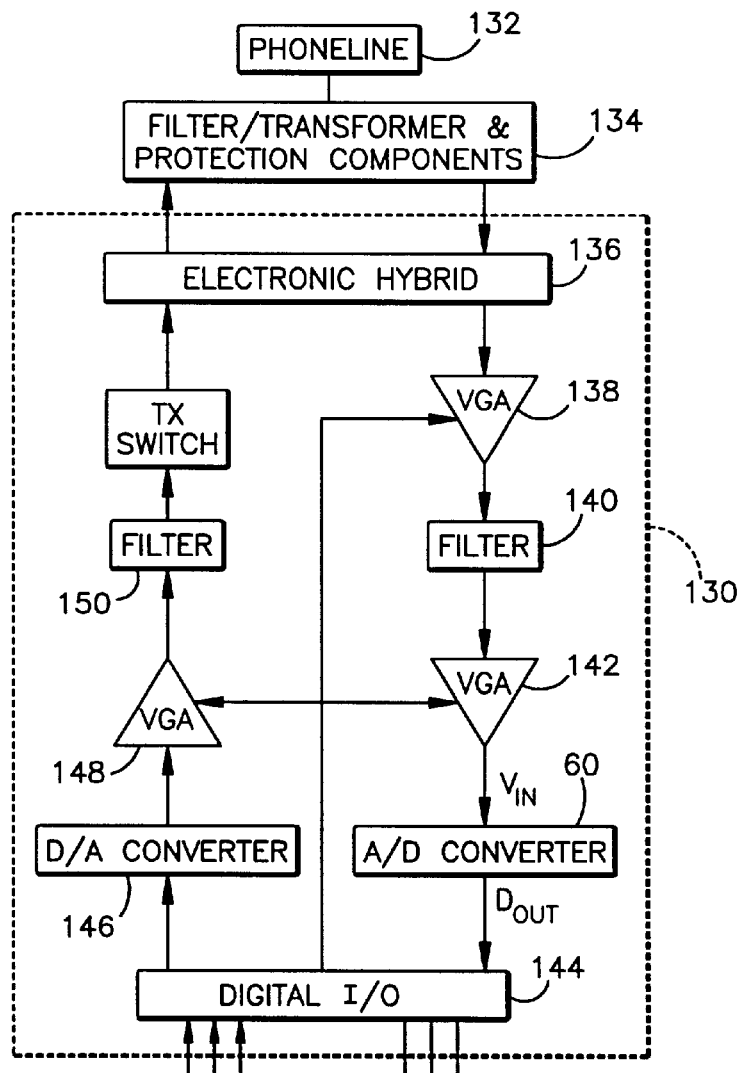
FIG. 12 is a block diagram of an analog front end circuit having the A/D converter illustrated in FIG. 6.

As another example application, the A/D converter 60 can be used as part of an analog front end circuit 130 (FIG. 12), or physical layer, of a networking device, such as a 10 Mbps or higher bandwidth in-home network data network operating over a conventional RJ11 telephone line 132. Referring to FIG. 12, the analog front end circuit 130 receives data signals from the telephone line 132 via a circuit 134 having components to condition the data signals, such as filters, transformers and surge protection. The received signals are processed by an electronic hybrid circuit 136 to perform functions such as collision detection. Next, the received signals are passed through a first variable gain amplifier (VGA) 138, a filter 140 and a second VGA 142 to further condition the received signals. The conditioned received signal is input into the A/D converter 60 as $V_{IN}$. As described in more detail above, the A/D converter 60 converts the analog input signal, $V_{IN}$, into a digital output, $D_{OUT}$. In this application, $V_{IN}$ is preferably sampled at 25 to 50 Msample/s and $D_{OUT}$ preferably has 10 to 12 bits. $D_{OUT}$ is then sent from the A/D converter 60 to a digital input/output (I/O) circuit 144. The digital I/O circuit 144 acts as an interface between the analog front end circuit 130 a subsequent network device circuit, such a circuit to implement the data link layer of an open systems interconnection (OSI) protocol stack.

Digital data output signals received from the subsequent network device circuit by the analog front end circuit 130 are received by the digital I/O circuit 144. The digital data output signals are converted into a transmit analog signal by a digital to analog (D/A) converter 146. The transmit analog signal is conditioned by a third VGA 148. The third VGA 148 acts as an adjustable gain transmit attenuator to allow for flexibility in setting the transmit power of the analog front end circuit 130. The attenuated transmit signal is further conditioned by a filter 150. The filtered, attenuated transmit signal is optionally passed through a transmit switch before being sent to the telephone line 132 through the electronic hybrid circuit 136 and the circuit 134.

Although particular embodiments of the invention have been described in detail, it is understood that the invention is not limited correspondingly in scope, but includes all changes, modifications and equivalents coming within the spirit and terms of the claims appended hereto.

What is claimed is:

1. A digital logic correction (DLC) circuit for a pipeline analog to digital (A/D) converter, the A/D converter having a plurality of stages, each stage producing at least a pair of digital output bits from which a digital representation of an analog input signal can be obtained, the DLC circuit comprising:

an adder, the adder having a plurality of inputs and an output;

a plurality of digital delay sets, each digital delay set comprising at least one digital delay, an input of the digital delay set receiving a corresponding digital output bit and an output of the delay set providing a delayed digital output bit to a respective adder input;

a clock generator, the clock generator providing clock signals to the DLC circuit to synchronize the arrival of the output of each digital delay set at the adder inputs during a data-valid-period;

wherein a primary clock signal is applied to the digital delay sets for every other stage, a secondary clock signal is applied to the remaining digital delay sets, the timing of the primary and secondary clock signals being effective to delay the digital output bits of each stage via the respective digital delay sets to cause the digital output bits to arrive at the adder inputs during the data-valid-period so that the adder produces the digital representation of the analog input signal at the adder output.

2. The DLC circuit according to claim 1, wherein the primary clock signal and the secondary clock signal form a two phase nonoverlapping clock.

3. The DLC circuit according to claim 2, wherein the clock signal applied to each delay set is the opposite phase of the two phase nonoverlapping clock used to latch the digital output bit being delayed by the delay set.

4. The DLC circuit according to claim 2, wherein a pulse of the primary clock signal and a pulse of the secondary clock signal have about the same length.

5. The DLC circuit according to claim 1, wherein each delay samples on a rising edge of the clock signal applied to the delay.

6. The DLC circuit according to claim 5, wherein the adder is synchronized with the primary clock signal.

7. The DLC circuit according to claim 1, wherein the adder is synchronized with the primary clock signal.

8. The DLC circuit according to claim 1, wherein the A/D converter has a sample and hold stage, the sample and hold stage sampling and holding the analog input signal and outputting a sampled and held signal, the A/D converter has a first stage, the first stage producing and latching a first digital output based on the sampled and held signal and producing a residue signal based on a comparison of the analog input signal and an analog representation of the digital output, and the A/D converter has a second stage, the second producing and latching a second digital output based on the residue signal produced by the first stage.

9. The DLC circuit according to claim 8, wherein the sample and hold stage has a tolerance of ±25% of the analog input signal.

10. The DLC circuit according to claim 8, wherein the DLC circuit and the pipeline A/D converter are part of a front end circuit for a data networking device and the analog input signal is an incoming data signal received over a telephone line.

11. The DLC circuit according to claim 1, wherein the number of bits in the digital representation of the analog input signal is odd, there are M number of stages producing digital output bits, each stage producing B number of digital output bits, and the total number of delays is equal to $B(1+M/2)(M/2)$.

12. The DLC circuit according to claim 1, wherein the number of bits in the digital representation of the analog input signal is even, there are M number of stages producing digital output bits, each stage producing B number of digital output bits, and the total number of delays is equal to $$B\left(\left(1+\frac{M-1}{2}\right)\left(\frac{M-1}{2}\right)+\frac{M+1}{2}\right).$$

* * * * *